April 14, 1970 R. J. GUTTERIDGE 3,506,887

SEMICONDUCTOR DEVICE AND METHOD OF MAKING SAME

Filed Feb. 23, 1966

INVENTOR.
Ronald J. Gutteridge

BY Mueller, Aichele & Rauner

ATTY'S

United States Patent Office 3,506,887

Patented Apr. 14, 1970

3,506,887

SEMICONDUCTOR DEVICE AND METHOD OF MAKING SAME

Ronald J. Gutteridge, Scottsdale, Ariz., assignor to Motorola, Inc., Franklin Park, Ill., a corporation of Illinois Filed Feb. 23, 1966, Ser. No. 529,390
Int. Cl. C23b *5/48;* H01l *3/00*
U.S. Cl. 317—234 3 Claims

ABSTRACT OF THE DISCLOSURE

A method of fabricating a thin film capacitor which includes anodizing an exposed surface of a masked face of a semiconductor wafer to form a thin oxide layer thereon, and thereafter forming a layer of metal on said thin oxide layer to form the top plate of the thin film capacitor.

Figure 1:
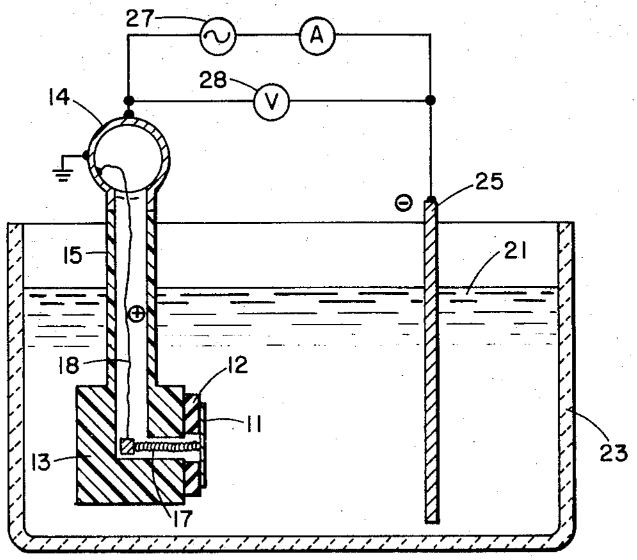

This invention relates to a method of forming a thin oxide layer on areas of a surface of a semiconductor wafer by an electrolytic process. More particularly, this invention relates to a novel method of forming a thin oxide layer by the electrolytic anodization of a masked surface of a semiconductor wafer, and relates to the fabrication of thin film capacitors including such oxide layers.

Oxides are generally formed on semiconductor wafers by either thermal growth or epitaxial deposition. Oxides formed by epitaxial deposition are primarily utilized in the initial steps of processing a semiconductor wafer whereas thermally grown oxides are used throughout the processing cycle for diffusion masks and surface protection. In the later processing steps of device fabrication, thermally grown oxides are utilized to the almost complete exclusion of epitaxial oxides.

To grow thermal oxides, a piece of semiconductor material, such as a silicon wafer, is subjected to an oxidizing atmosphere at an elevated temperature between about 900° and 1200° C. At 1100° C., an oxide layer about 500 angstroms thick will grow on the surface of a silicon wafer in about ten minutes. These thermally grown oxides are generally limited to a minimum thickness of about 500 angstroms because of limitations on the control of the growth rate and the presence of pinholes in thinner layers. The temperature utilized to grow these oxides is high enough that it will alter the depths of the PN junctions and thereby alter the characteristics of the device. Therefore, allowances must be made during prior processing steps for variations that occur during the thermal oxide growth.

Capacitors for integrated circuits may generally be characterized as junction or thin film type. Junction type capacitors for monolithic integrated circuits take advantage of the capacitance of junctions between material of different conductivity types. Thin film capacitors are similar to discrete capacitors in that they consist of two conducting plates separated by a dieletric material. In integrated circuits, thin film capacitors are normally formed on a low resistivity portion of the semiconductor wafer which is oxidized and has a layer of metal deposition thereon. The term "thin film" indicates a layer less than about one micron.

To form the dielectric for these capacitors, the surface of the semiconductor wafer is exposed at the capacitor areas and an oxide grown thereon by the thermal process described above. To be a satisfactory dielectric, this thermal oxide must have sufficient thickness to avoid any pinholes which would result in the shorting of the top capacitor plate with the bottom capacitor plate. Because the thickness of the capacitor dielectric is critical, this thermal oxide growth is the last high temperature operation in the device fabrication. This is usually undesirable because of the effect of high temperature on previously formed regions.

High quality oxide films are also formed by the electrolytic process of anodization. This is an electrolytic process in which the material to be oxidized is placed in an electrolyte and a potential applied that makes the material electrically positive relative to a cathode in the electrolyte. Thin, nonporous and uniform oxides formed in this manner have been widely used to protect the surface of many materials.

Pieces of semiconductor material have also been oxidized with the anodization process. Electrical contact is made to a portion of a piece of semiconductor material projecting from an electrolyte and an oxide, limited to a few thousand angstroms, is grown on the immersed portion of the piece. This oxide layer provides some protection for the surface of the piece of semiconductor material, but its use is limited in the semiconductor field because the thickness is not sufficient to provide an effective diffusion mask and because other well developed oxidizing techniques are more efficient for that purpose. Although it was previously considered desirable to form oxide layers on a plurality of regions on a semiconductor wafer, no method of so doing which was economically feasible for the fabrication of devices was known.

An object of the invention is to provide a novel method of growing a high quality oxide coating by electrolytic action on a masked surface of a semiconductor wafer at a relatively low temperature.

An additional object of this invention is to provide a method for shielding a surface of a region of a semiconductor wafer from the formation of irregularities therein during gaseous diffusion of a dopant.

Another object of the invention is to provide a method for growing oxides to closely controled thickness that substantially reduces the formation of pinholes therein.

A further object of the invention is to provide a method to reduce the cost and improve the yield of thin film capacitors on semiconductor devices.

A still further object of the invention is to provide a novel method of fabricating thin film capacitors for a semiconductor device without affecting the previously established characteristics of the device.

A feature of the invention is a novel method of forming a thin oxide layer by the anodization of a masked surface of a semiconductor wafer, in which areas to be anodized are exposed to an electrolyte and an anodizing potential is applied to a different surface of the semiconductor wafer that is protected from the electrolyte.

In the accompanying drawings:

FIG. 1 is a view in section of the equipment utilized in the formation of an oxide coating according to the invention.

Figure 2:
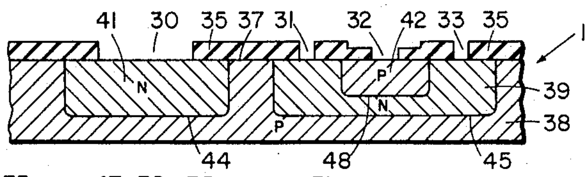
Figure 3:
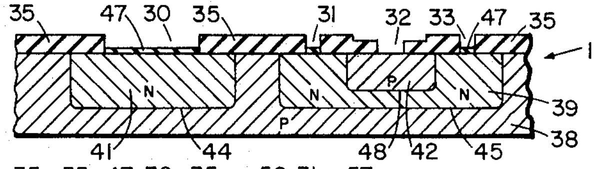
Figure 4:
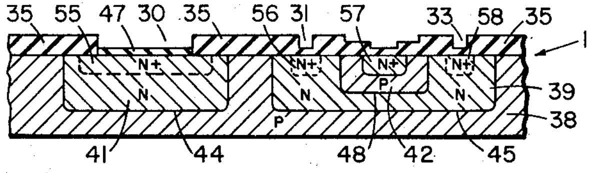
Figure 5:
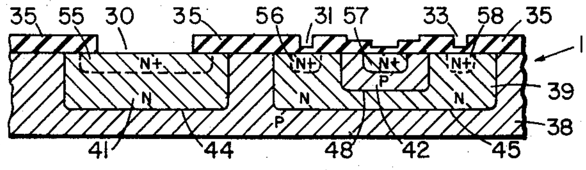
Figure 6:
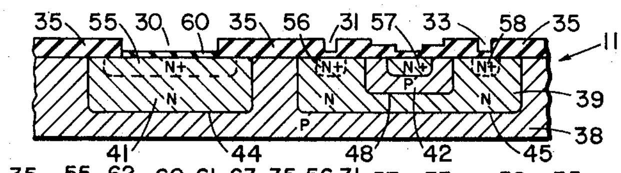
Figure 7:
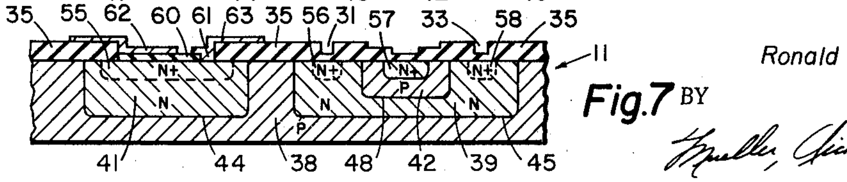

FIG. 2 is an enlarged view in section of a portion of an integrated circuit prior to anodization of exposed areas, FIG. 3 is an enlarged view in section of a portion of an integrated circuit with an oxide layer thereon formed according to the invention, FIG. 4 is an enlarged view in section of a portion of an integrated circuit after an N+ type diffusion has been performed, FIG. 5 is an enlarged view in section of a portion of an integrated circuit with an area exposed in preparation for the fabrication of a thin film capacitor thereon, FIG. 6 is an enlarged view in section of a portion of an integrated circuit after the anodization of the area exposed in FIG. 5, and FIG. 7 is an enlarged view in section of a portion of an integrated circuit with a thin film capacitor formed thereon.

The invention is embodied in a method of forming an oxide layer on a face of a semiconductor wafer that has been masked with an electrically insulating material. The wafer is mounted on supporting means so that only the face to be anodized is exposed. An anodizing electrical potential is applied to the face while the face is immersed in an electrolyte. This anodizing electrical potential is maintained until an oxide of the desired thickness is formed.

The invention is also embodied in a thin film capacitor comprising a wafer of semiconductor material of a first conductivity type, a region in the wafer terminating at one surface thereof of a different conductivity type with the region projecting into the wafer to a predetermined depth. This region forms the bottom-plate of the capacitor. A thin substantially void free low temperature anodized layer of the wafer of a uniform thickness is disposed on a portion of the region and an ohmic contact is connected electrically to the region. A layer of electrically conducting material on the anodized layer forms the top-plate of the capacitor.

The wafer which is treated in accordance with the method of the present invention is masked with an electrically insulating material prior to anodization. The mask advantageously is made by forming a coating over one entire surface of the wafer and then removing portions thereof to produce a masking pattern. Preferably, the mask is formed of an oxide of the semiconductor material in the wafer and particularly silicon dioxide.

The thickness of the electrically insulating material may vary over a considerable range and may be advantageously between about 6000 and 8000 angstroms thick. Where the masking material is silicon dioxide, it may be formed by a thermally grown oxide layer or an epitaxially deposited layer.

Openings may be formed in the layer to produce the masking pattern by any of the methods known and employed in the semiconductor art. For example, the openings may be made by forming a photoresist pattern on the surface and then etching the openings through the layer to expose portions of the wafer surface.

Prior to the treatment in accordance with the present invention, it is advantageous to form various doped regions in the wafer. For example, in the fabrication of a transistor, the base and the emitter regions may be formed in conjunction with the collector region by known diffusion and/or epitaxial techniques. In the fabrication of integrated circuits, a large number of different regions are formed in the wafer prior to the treatment in accordance with the method of the invention.

For the anodization treatment, the masked wafer is immersed in an electrolyte. Preferably, this electrolyte comprises tetrahydrofurfuryl alcohol and an oxygen containing salt. Salts suitable for this purpose include ammonium per sulfate, potassium nitrate, potassium nitrite, sodium nitrate and sodium nitrite.

When selecting the major constituent of the electrolyte, such as the tetrahydrofurfuryl alcohol mentioned above, its current limiting properties should be considered. Since the current flowing in a forward biased PN junction approaches infinity, generally at less than one volt, the electrolyte selected for the anodization should have a much higher resistance than the semiconductor wafer. Preferably, the major constituent in the electrolyte will act as a current limiting means so as to prevent the semiconductor wafer from burning out before suitable anodizing conditions are obtained.

The temperature of the electrolyte during the anodization is not thought to be critical. Favorable conditions have been obtained with the electrolyte temperatures between about 10° and 80° C. Preferably, the anodization is performed at ambient room temperature (about 20° C.).

The areas anodized according to this invention will often be between about 0.1 and 1000 square mils in area. With a large number of such areas the use of a calculated current density is believed to be impractical. From observation of the rate of growth and the quality of oxide produced, and the same starting voltage, the same current density may be repeatedly applied for a series of separate anodizations with the resulting anodized layers being substantial duplicates.

The anodization may be performed by varying both the current and the voltage on the system. For the invention, the use of constant current from a good constant current source is preferred. Any of the good constant current sources that are well known may be used. With constant current, control of the anodized layer thickness is obtained by selecting the starting and terminating voltages of the process. Additionally, the high voltage associated with the use of constant current aids in the formation of a high quality, void free layer by creating high potential spots at defects which, because of the high potential, rapidly anodize to form a high quality oxide. This substantially void free and uniform oxide layer may be repeatedly grown for thicknesses varying from between about 100 to 2000 angstroms. Thicknesses in this range may be repeatedly grown because the potential of the system is directly relatable to the thickness of the anodized layer.

The method of the invention will be described in greater detail with reference to the apparatus shown in FIG. 1 which is one form of apparatus suitable for the purpose of the present invention. A semiconductor wafer 11 is mounted on a silicone rubber gasket 12. Gasket 12 is fabricated from a soft material so that no damage will occur to wafer 11 when it is held thereon by a vacuum. A Teflon chuck 13 which is connected to a steel vacuum line 14 by a Teflon tube 15 supports gasket 12 and wafer 11. Chuck 13 is rotatable from the vertical position shown in FIG. 1 to a horizontal position to facilitate the placing of wafer 11 on gasket 12. Wafer 11 is connected through a coil spring 17, a wire 18 and vacuum line 14 to an electrical circuit. When chuck 13 is in a vertical position it is immersed in an electrolyte 21 that is contained in a tank 23. Tank 23 is constructed of a material that is resistant to attack by the electrolyte. Additionally, tank 23, chuck 13 and tube 15 should be electrical insulators to facilitate the control of the conditions of the anodizing circuit. To complete the anodizing circuit, a movable stainless steel cathode 25, that may be placed at varying distances from wafer 12, is provided. The anodizing potential is supplied by a constant current source 27 that has a voltmeter 28 connected in parallel therewith to be used to determine the starting voltage of the anodization.

In practicing the invention, a semiconductor wafer 11 of silicon having a plurality of openings 30, 31, 32 and 33 (FIG. 2) formed in an insulating layer 35 disposed on a face 37 thereof is positioned on the chuck of the equipment described above. Wafer 11 is comprised on a P type substrate 38 with N type regions 39 and 41 formed therein and P type region 42 formed in N type region 39.

Wafer 11 is immersed in an electrolyte and an anodizing potential applied thereto. The applied current readily passes through forward biased PN junctions 44 and 45 to form an anodized layer 47 (FIG. 3) on surface 37 of openings 30, 31 and 33. The thickness of layer 47 relative to layer 35 has been exaggerated in the drawings for clarity in the explanation of the invention.

Reverse biased PN junction 48 does not allow current to pass through to area 32, and therefore, no anodization takes place thereon. It is possible that the reverse voltage breakdown of PN junction 48 could be exceeded, at which time anodization would be initiated on the surface of area 32.

Anodized layer 47 is advantageously used to prevent the etching of surface 37 in selected regions that are subjected to a phosphorus diffusion utilizing $POCl_3$ as a doping source. N+ regions 55, 56 and 58 (FIG. 4) have substantially identical profiles to that of N+ region 57 even though the impurity was diffused through protective layer 47.

In fabricating a thin film capacitor for an integrated circuit, N+ region 55 is preferred for the formation of the capacitor bottom-plate. In the formation of the capacitor dielectric, anodized layer 47 is removed from surface 37 in opening 30 (FIG. 5). Surface 37 of area 30 is in an advantageous condition for the formation of a thin film capacitor because the surface is very smooth as a result of the careful preparation thereof during the earlier processing steps wherein the surface of the wafer was mechanically and chemically treated to obtain a smooth surface. This surface is retained in that condition because of the protection previously described. The smoothness of this surface is very important for a thin film capacitor in which the dielectric is only a few hundred angstroms thick. Variations in the surface may radically alter the characteristics of the capacitor.

Utilizing the equipment described above, surface 37 in area 30 is anodized to form an anodized layer 60 (FIG. 6) to be used for the capacitor dielectric. Previously mentioned photoresist techniques are utilized to remove a portion of layer 60 to expose a contact area 61 on region 55. Aluminum is deposited and patterned to form a capacitor top-plate 62 and external connection 63 to contact 61 on capacitor bottom-plate 55 to complete the thin film capacitor.

The following examples illustrate specific embodiments of the invention, although it is not intended that the examples in any way restrict the scope of the invention.

EXAMPLE I

The above described apparatus was employed in the formation of a surface protection for silicon wafers. A number of silicon wafers about 1 inch in diameter and 8 mils thick, that had been partially processed to form a plurality of integrated circuits, were masked with silicon dioxide and mounted on the apparatus described above. These wafers were immersed in an electrolyte maintained at about 20° C. The electrolyte was a mixture of 10 grams of potassium nitrate dissolved in 4 liters of tetrahydrofurfuryl alcohol.

An anodizing potential of 80 volts was applied between the wafers and a stainless steel cathode placed about 20 centimeters therefrom. The current established by this initial voltage was maintained constant throughout the anodizing cycle with the cathode being maintained at a more negative electrical potential than the wafers. This constant current was maintained until the electrical potential reached 180 volts.

The resulting anodized layer was about 400 angstroms thick and substantially free of pinholes or other defects. This layer was utilized as a surface protection during a $POCl_3$ diffusion and there was no evidence of it having any effects upon the diffused impurity profile. Unlike the exposed surface of silicon that was pitted during this diffusion, the protected surface was free of pits upon removal of the anodized layer.

EXAMPLE II

Utilizing an anodized layer as described in Example I, a $POCl_3$ diffusion was performed to form N+ type regions in the silicon wafers. Selected of these regions had the silicon surface of the wafer exposed for the formation of thin film capacitors thereon by the removal of the silicon dioxide thereon. The wafer was immersed in an electrolyte having a composition similar to that described in Example I. A stainless steel cathode was again placed about 20 centimeters from the wafers, and an anodizing potential was established between the wafer and the cathode, of about 80 volts. The current developed by this initial voltage was maintained constant until the potential of the system had risen to 180 volts, at which time the current was terminated.

An oxide layer about 500 angstroms thick was grown in about two minutes under these conditions. This oxide was substantially uniform in thickness throughout and substantially free of pinholes.

To complete the thin film capacitor, an opening was made in the anodized layer to expose a contact area on the underlying N+ type region. Aluminum was evaporated on the face of the wafer and patterned to form the capacitor top-plate and capacitor bottom-plate contacts. The resulting thin film capacitor had a capacitance of about 0.5 pf. per square mil plus or minus 10 percent.

The dielectric for thin film capacitors formed according to the above method was substantially free of pinholes. Because of this much higher quality dielectric, the yields of satisfactory devices improved about 300% as compared to thermally grown dielectrics.

The above description and drawing show that the present invention provides a novel method of forming a thin oxide layer by anodization of a plurality of areas on a surface of a semiconductor wafer, and the fabrication of thin film capacitors including such oxide layers. Furthermore, by the method of the invention an oxide is grown by electrolytic action on a surface of a semiconductor wafer at a relatively low temperature. Moreover, the oxide is closely controlled in thickness and is substantially free of pinholes. Additionally, by the method of the invention a shielding layer is provided that prevents the etching of the semiconductor surface during corrosive type diffusions. Also, a thin film capacitor is provided in which the previously established characteristics of the device are not affected and the resulting device cost is lower because of higher yields of satisfactory units.

What is claimed is:

1. A method of forming an oxide layer by anodization on a masked face of a semiconductor wafer, which method comprises mounting a semiconductor wafer having a face masked with electrically insulating material on supporting means so that only said face is exposed, applying an anodizing electrical potential to said exposed face while immersing said exposed face in an electrolyte, maintaining said anodizing electrical potential until an oxide is formed on said exposed face, said oxide corresponding to the location of thin film capacitors to be formed on said surface, removing said wafer from said electrolyte, cleaning said semiconductor material, removing a portion of said oxide to expose portions of said exposed face, depositing a metal on said electrically insulating material and said oxide, and removing portions of said metal to form capacitor bottom plate contacts and capacitor top plates.

2. A method according to claim 1 in which said semiconductor material under said oxide has a low resistivity.

3. A thin film capacitor comprising a wafer of semiconductor material of a first conductivity type, a region in said wafer terminating at one surface thereof of a different conductivity type than said wafer, said region projecting into said wafer to a predetermined depth, said region forming a bottom-plate of said capacitor, a thin substantially void free low temperature anodized layer of said wafer of a uniform thickness throughout on a portion of said region, an ohmic contact connected electrically to said region, and a layer of electrically conducting metal on said anodized layer forming a top-plate of said capacitor.

References Cited

UNITED STATES PATENTS

| | | | |
|---|---|---|---|
| 3,097,308 | 7/1963 | Wallmark | 317—235 |
| 3,400,310 | 9/1968 | Dorendorf et al. | 317—234 |
| 3,402,332 | 9/1968 | Thire | 317—230 |
| 3,411,053 | 11/1968 | Wiesner | 317—235 |
| 3,388,048 | 6/1968 | Szabo | 204—15 |
| 3,240,685 | 3/1966 | Maissel | 204—15 |
| 3,220,938 | 11/1965 | McLean et al. | 204—15 |
| 3,311,546 | 3/1967 | Berry et al. | 204—15 |
| 3,328,272 | 6/1967 | Sandmann et al. | 204—14 |
| 3,345,274 | 10/1967 | Schmidt | 204—15 |

JOHN H. MACK, Primary Examiner

T. TUFARIELLO, Assistant Examiner

U.S. Cl. X.R.

204—15; 317—230